United States Patent [19]

Kuenemund

[11] 3,781,717

[45] Dec. 25, 1973

[54] PIEZOELECTRIC FILTER HAVING RESONATORS FORMED BETWEEN ADJACENT INTERFERENCE LOCATIONS

[75] Inventor: Friedrich Kuenemund, Muenchen, Germany

[73] Assignee: Siemens Aktiengesellschaft, Berlin and Munich, Germany

[22] Filed: June 29, 1972

[21] Appl. No.: 267,424

[30] Foreign Application Priority Data

| | | |
|---|---|---|
| July 6, 1971 | Germany | P 21 33 634.5 |
| Nov. 26, 1971 | Germany | P 21 58 858.9 |
| Feb. 29, 1972 | Germany | P 22 09 585.8 |

[52] U.S. Cl. .......................... 333/6, 310/9.8, 333/72

[51] Int. Cl. ........ H03h 7/46, H03h 7/04, H03h 9/26

[58] Field of Search ................. 333/30 R, 30 M, 72, 333/6; 310/9.8

[56] References Cited

UNITED STATES PATENTS

| | | | |
|---|---|---|---|
| 3,437,848 | 4/1969 | Borner et al. | 333/72 X |
| 3,662,293 | 5/1972 | DeVries | 333/72 X |

*Primary Examiner*—Paul L. Gensler
*Attorney*—Benjamin H. Sherman et al.

[57] ABSTRACT

An electromechanical device operating on the surface-wave principle as a transducer of a filter comprises a substrate carrying a plurality of electrodes. The substrate may include a piezoelectric material and have interference locations defining resonant circuits. The interference locations may include a broken line of laser produced spots, a protuberance or a groove extending perpendicular to the direction of wave propagation.

29 Claims, 7 Drawing Figures

PIEZOELECTRIC FILTER HAVING RESONATORS FORMED BETWEEN ADJACENT INTERFERENCE LOCATIONS

BACKGROUND OF THE INVENTION

1. Field of the Invention

The present invention relates to electromechanical transducers, and to surface wave electrical filters employing such transducers.

2. Description of the Prior Art

Filters of the kind employing input and output transducers each having a body consisting at least partially of piezoelectric material and provided with electrodes to convert electromagnetic oscillations into acoustic surface oscillations which are subsequently converted back into electromagnetic oscillations are disclosed, for example, in an article entitled "Acoustic-Surface-Wave Filters" published in the periodical "Electronics Letters," Vol. 5, No. 25, Dec. 11, 1969. The mode of operation of this type of filter is essentially that interdigitated excitatory electrodes are applied to a piezoelectric monocrystal to form a transducer using the piezoelectric effect, this structure being employed to convert electromagnetic waves into surfaces waves on a surface of a linking body located between the transducer systems, which acts as a propagation interval for an acoustic surface wave. As the aforesaid article indicates, this produces a filter characteristic, corresponding to that of a free-circuit band-pass filter, and this is confirmed in particularly by the steepness of the attenuation edges in relation to the width of the pass band filter. However, with this kind of arrangement it does not appear to be possible to increase the filter factor by an arbitrary amount to match the filter to any given attenuation requirements. In particular, this applies to the requirements, for example, to obtain a given Tschebyscheff characteristic in a pass band and possibly also in a stop band, i.e. a steepening of the attenuation by the production of attenuation folds. Also, it does not appear possible to produce complex pole positions in the transfer function, in order to flatten out the delay characteristic. On the other hand, in an article entitled "Filters and Dispersive Delay Lines Using Repetitively Mismatched Ultrasonic Transmission lines," which appeared in the publication "IEEE Transactions on Sonics and Ultrasonics" Vol. SU-15, No. 2, April 1968, a multi-element low-pass filter is described which consists of a periodic structure of successive line sections with different cross sections. However, in this case, the wave used for transmission is primarily a volume wave whose excitation and pick-up are effected by means of piezoelectric transducer systems applied at the ends of the transmission medium. This arrangement is fundamentally intended for use as a delay line and the periodic structure is used simply to geometrically shorten the necessary length of electrical line. This article does not refer to the design of band pass filters, especially as regards their operating parameter theory.

In an article published in the magazine "1967 IEEE International Convention Record" Vol. 15 Part 11, pages 78 to 93, there is described the use of crystal-controlled channel filters of monolithic design operating at a frequency of around 8 MC/s in carrier frequency channel converters, in which the mechanical quality factor of the resonators is about 250,000. It has been found that, because of the high frequency and despite the high quality factor, the attenuation distortions at the edges of the pass band are too severe in many such applications.

The filters described hereinbefore utilize electromechanical transducers to convert electrical oscillations into mechanical oscillations. and in particular to generate surface waves in the case where these transducers excitation electrodes are applied to a body of electrostrictive material and a wave sink for mechanical waves is provided in the direction opposite to the requisite direction of wave propogation.

Transducers of the aforedescribed are used, for example, in many mechanical filters for the excitation and pick-up of oscillations, as those skilled in the art will appreciate, so that the energy supplied to the filter in the form of electrical oscillations is first of all converted into mechanical oscillatory energy and the selective process can then be effected in the mechanical intermediate part of the filter. At the output of this kind of filter, a further transducer is provided which converts mechanical oscillatory energy back to electrical oscillations so that the latter can be suitably processed. Transducers of this kind are described, for example, by P. Mason in his book "Physical Acoustics," I, Part A, Academic Press, 1964, New York and on page 238 in particular the results of a derivation of the electrical equivalent circuit diagram, are set out. In these transducers, on an acoustic line section consisting of piezoelectric material, at least two mutually independent excitation electrodes are provided to which the input a.c. voltage is applied. It is also possible to provide several interdigitated excitation electrodes. Generally speaking, the effort will be towards ensuring that the acoustic wave propagates in only one direction, so that on that side or end of the transducer opposite to the propagation direction there is either a lining of material which acts as a wave sink with respect to acoustic waves, or the structure is arranged to provide focal reflection in order to ensure that the wave initially propagating in opposition to the requisite propagating direction is superimposed in-phase on the wave initially travelling in the requisite direction.

If, considering electromechanical transducers of this kind which have no coils, one disregards losses due to the finite mechanical quality factor, then for arbitrarily selectable bandwidth the pass band attenuation is inversely proportional to the square of the effective coupling factor K of the electromechanical material, or, at a pass band attenuation of O, the relative bandwidth B is directly proportional to the square of the coupling factor. This depends upon whether the line before the input transducer and after the output transducer is terminated in a reflection-free or totally reflecting fashion. As far as quality factor, temperature stability and aging are concerned, quartz crystal is excellently suited as a material for high-grade filters of this kind, in particular when operation at frequencies above some few hundred kHz is involved. Because of the low coupling factor, for example, K=0.05, however, either a pass band attenuation of around 60 dB or a maximum possible relative band-width of about one part in a thousand is obtained.

SUMMARY OF THE INVENTION

One object of the present invention is to provide a transducer and/or a filter construction which overcomes the difficulties which have been listed hereinbefore.

Another object of the invention is to permit the construction of filters which employ the principle of surface wave propagation and yet are not subject to any undesirable design limitations regarding the satisfaction of predetermined requirements, while at the same time being capable of optimum design to satisfy relatively stringent requirements, such as are encountered in equipment for carrier frequency operation.

Furthermore, it is my intention to provide electromechanical transducers, in particular transducers for generating acoustic surface waves, which have very few halfwave transducer sections and which, even where the effective coupling factor of the electromechanical material is relatively small and where the pass band attenuation is relatively low, can be designed for larger band widths than heretofore.

According to the invention, an electromechanical transducer or a surface wave electrical filter employs a body consisting at least partially of piezoelectric material having electrodes thereon in order to convert electromagnetic oscillations into acoustic surface oscillations, and in which a surface of said body is provided with interference locations for surface waves. These interference locations extend substantially perpendicular to the direction of wave propagation and have dimensions in that direction which are small compared with the wave length of the surface wave. A resonator is formed by each interval between neighboring disturbance locations in association with the intervening surface sections.

The trimming of the individual resonators can advantageously be effected by applying individual disturbance locations to the surface of the sections forming the individual resonators, so that the effective length of the individual sections is modified.

Filters of this kind can also be developed to form divider networks, by arranging, in the course of the surface of the body, at least two mutually decoupled filter systems with different pass bands, which decoupled filter systems are excited by a common input transducer system, and each of which is provided with its own output transducer.

In order to satisfy the stringent requirements encountered in particular in carrier frequency work, it is advantageous if the individual resonators are tuned to a resonant frequency in the order of 800 kHz, i.e. the resonant frequency of the resonators should lie between a lower limit of about 600 kHz and an upper limit of about 1 MHz.

BRIEF DESCRIPTION OF THE DRAWINGS

Other objects, features and advantages of the invention, its organization, construction and operation will be best understood from the following detailed description of preferred embodiments thereof, taken in conjunction with the accompanying drawings, on which.

DESCRIPTION OF THE PREFERRED EMBODIMENTS

Figure 1:
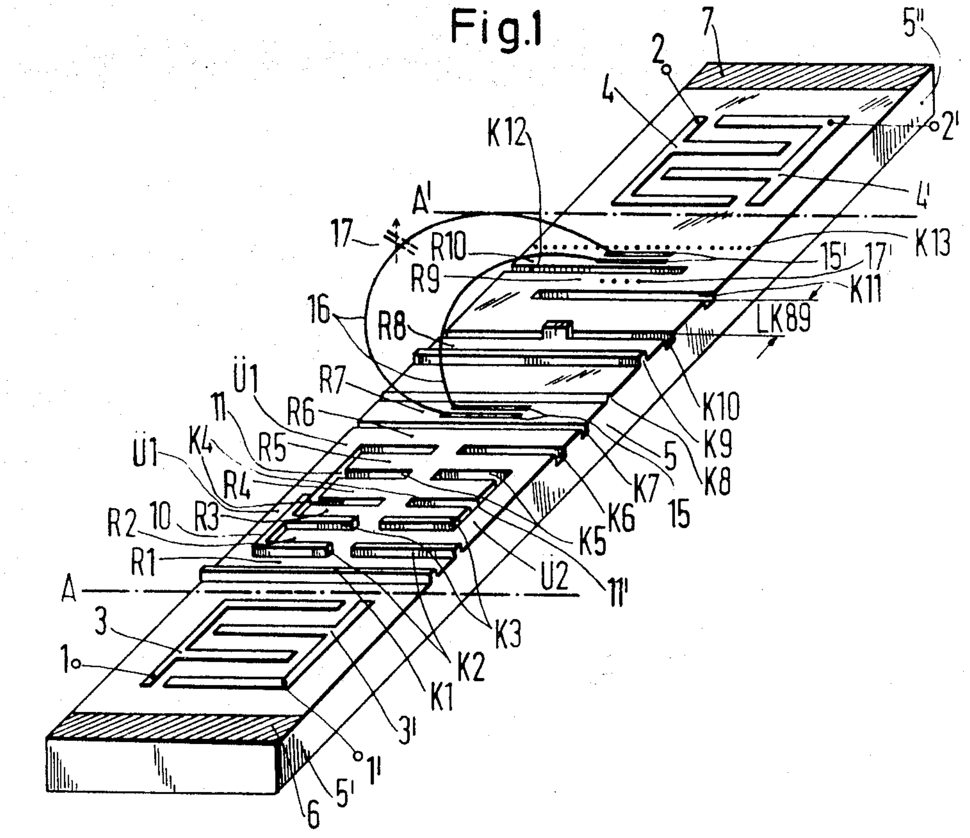
FIG. 1 illustrates the structure of one exemplary embodiment of a filter constructed in accordance with the principles of the present invention.

The exemplary filter embodiment shown in FIG. 1 comprises a parallelepiped body which is sub-divided into three sections 5, 5′ 5″ at section planes A and A′, indicated by broken lines, extending perpendicular to the surfaces of the body. The intermediate section 5, which has the filter action proper, is located between the two planes A and A′, while the terminal sections 5′ and 5″ are used, respectively, as transducers for the excitation and pick-up of surface waves. The terminal sections 5′ and 5″ are constructed of a piezoelectric material upon a surface of which at least one pair of mutually independent electrodes is arranged which serve to convert applied electromagnetic oscillations into acoustic surface oscillations, or vice versa. In the example illustrated the electrode structure on the transducer section 5′ comprises a pair of conventionally designed interdigited electrodes 3 and 3′, to which terminal lead 1 and 1′ are respectively connected. The transducer element 5″ is constructed in precisely the same manner and is provided with electrodes 4 and 4′ to which leads 2 and 2′ are respectively connected. If an electromagnetic wave is supplied to the terminals 1 and 1′, then, because of piezoelectric effect, this wave is converted into an acoustic surface wave which, depending upon the relative directions of polarization of the electrical wave and of the material, propagates as a Bleustein wave or a Rayleigh wave. In the case of a Bleustein wave, as those skilled in the art will appreciate, the surface of the transmission medium is subjected to shear stress, whereas in the case of a Rayleigh wave, the surface is distorted to form wave crests and troughs. The acoustic wave propagates in both directions from the excitation electrodes along the surface of the body, and therefore a so-called wave sink 6 is provided at the end of the transducer element 5′ and a wave sink 7 at the end of the transducer element 5″. These wave sinks 6, 7 damp any wave component propagating in the unwanted direction.

In the design of known filter arrangements effort has been directed to providing the surface of the transmission medium with the most uniform and smoothest possible finish, whereas, in the case of the present invention the starting consideration is to provide continuous or interrupted, strip-like interference locations, each perpendicular to the direction of propagation of the waves. Interference locations are provided wither by the application of material to the surface, or by the removal of material from the substrate surfaces, so forming interference locations suitable for reflecting surface waves in the desired number. It is merely necessary to ensure that the dimension of the interference locations in the direction of propagation of the surface wave, is small in comparison with the wavelength of the surface wave. By designing the interval between neighboring interference locations such that in association with the particular intervening surface section a resonator is produced, then structures of this type can be used to provide a filter which can fundamentally consist of any arbitrary number of resonators, and with which, therefore, basically any desired transmission characteristics can be obtained. For these reasons, the filter body 5 located between the planes of sections A and A' need not necessarily itself consist of a piezoelectric material, and other materials can be used which do not depend upon the exploitation of the piezoelectric effect. If the aim is that of achieving a high quality factor in association with a low temperature coefficient then materials which are particularly suitable are quartz glass or a steel alloy with a low temperature coefficient. Steel alloys of this kind are available, for example, under the trade name "Thermelast."

In order to produce the aforementioned type of filters, it is possible to directly apply well known microwave theory, such as is disclosed for example in an article by W. Mumford entitled "Maximally Flat Filters in Wave Guides," published in the periodical "Bell System Technical Journal" 27, pages 684 to 713 (1948). In accordance with this article, a line section of length $l$ and a phase $b$, having input and output sides of which in each case a shunt conductive $jy$ is connected, is equivalent to a four-terminal section in whose shunt arm there is a parallel resonant circuit. The phase of the line section is calculated in accordance with the formula:

$$b = 2\pi l/\lambda = n\pi + \arctan 2/y$$

and the
band width $\Delta f/fo$ is calculated from the formula $$\Delta f/fo = (2/b) \cdot \arcsin 2/\sqrt{y^4+4y^2}$$

Commencing from this, in the example illustrated in FIG. 1 the interference locations are formed by a plurality of wall-like protuberances, such as those marked K1 to K3, and by trench-like recesses, such as K4 to K7 and K11 to K13. As shown, the interference location K13 can take the form of an interrupted line, or as exemplified by K10, the design may be a combination of recessed and protruding sections. In accordance with the aforementioned theory, the conductance $y$ assigned to the particular interference locations, can for example be determined by measurement, and depends upon the height and width dimensions of the particular interference location. If the interval between the interference locations is measured in the indicated manner, the section of the surface located between the interference locations forms, together with the locations themselves, an individual resonator, so that in the example of FIG. 1, a plurality resonators R1 to R10 are formed. Interference locations represent the coupling between individual resonators and because of the additional mass which has to be moved in the case of a protuberance, assuming the force-stress analogy, inductance coupling in a shunt arm is effectively simulated. A recess, because of the interruption which the surface wave encounters, simulates a capacitive coupling. The individual interference locations of the wall-like type can be made of the same material as the filter body, and may be produced for instance by vapor deposition, while recesses may be formed by etching, laser bombardment or other removal processes. If the filter body 5 consists of a piezoelectric material whose piezoelectric properties are not to be exploited, a material such as quartz may be used, on which interference locations are produced by vaporizing on metal coatings.

It is not essential for the interference location to extend over the entire surface perpendicular to the direction of propagation of the surface wave, and indeed in many cases it will suffice if the interference locations extend only over part of the surfaces, as indicated for example in the case of the locations K2, K6 and K11.

In filters in which the circuit elements take the form of distributed elements, i.e. line sections, it is additionally of importance, as far as design is concerned, to include coupling lines between individual resonators, i.e. phase-shift elements. This kind of coupling line is simulated in part in the example of FIG. 1 by a line section LK 89.

Figure 2:
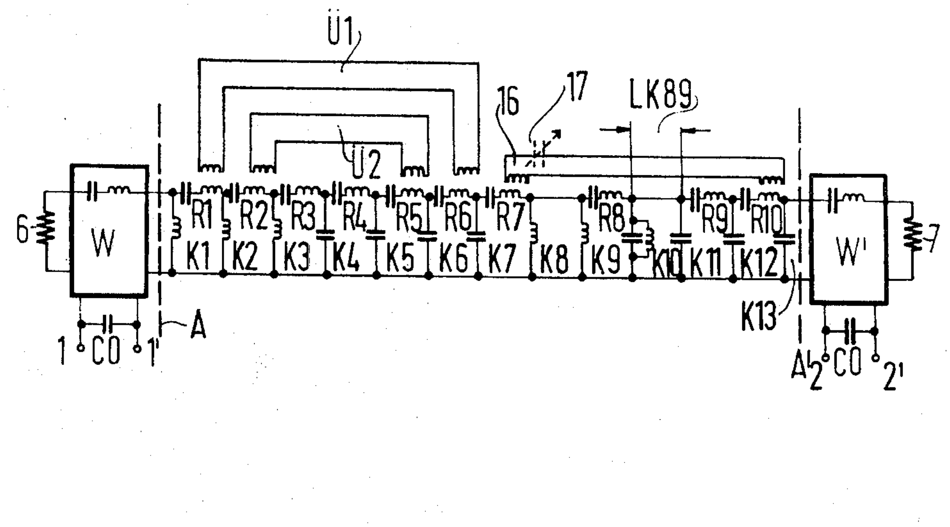
FIG. 2 is a schematic diagram of the equivalent circuit for the embodiment shown in FIG. 1.

In FIG. 2, the electrical equivalent circuit diagram of the mechanical system illustrated in FIG. 1, has been illustrated and, for ease of understanding, individual elements which have the same function have been given the same reference characters as the corresponding components in FIG. 1.

Between the lines of section, A and A', in the equivalent circuit diagram of FIG. 2, an electrical four-terminal device is provided which is equivalent to the mechanical components of the section 5 described with reference to FIG. 1. This four-terminal device consists of a ladder network whose series arms are formed by the resonant circuits R1 to R10 and whose shunt arms are formed by the coupling arrangements between the individual resonator circuits, marked to correspond with the interference locations K1 to K13. As already mentioned, the coupling arrangements K1 to K3, K8 and K9, may be regarded as inductive arrangements, because of the protuberance of the surface of the filter body, and the coupling arrangements K4 to K7 and K11 to K13 may be regarded as capacitive arrangements because of the recesses in the surface. The coupling K10, which comprises both a recess and a protuberance, is shown in the equivalent circuit diagram as a parallel resonant circuit. Also shown in the equivalent circuit diagram is the line section LK 89 between the resonant circuits R8 and R9.

Connected before and after the actual mechanical section are a pair of respective transducers W and W', to which the input terminals 1 and 1', and output terminals 2 and 2' are connected respectively. Preceding and succeeding the transducers there are the electrical terminal resistors 6 and 7, which are formed in the example shown in FIG. 1 by the wave sinks for surface waves, which absorb those energy components of the surface wave which do not propagate in the requisite direction in the filter assembly. Between the two input terminals, and also between the two output terminals, there is a respective static capacitance Co, which is that formed between the excitation electrodes of the respective transducer elements. The sections thus shown outside the lines A, A' represent the transducer elements 5' and 5'' of the example shown in FIG. 1 and in the series arm of the equivalent circuit for each transducer element there is a further series resonant circuit, because if suitably designed, the transducers themselves can also act as resonant circuits.

In order to produce attenuation poles in the attenuation characteristics of the filter and to generate complex poles in order to influence the delay in the pass band of the filter, it is possible, as those skilled in the art will be aware, to additionally associate resonant circuits which are not directly adjacent, in a predetermined, cophasal manner by the use of transfer-coupling arrangements, so that it becomes possible, in a more simple manner and with a smaller number of filter resonators, to adapt the filter to given requirements in terms of the transfer characteristic. Transfer coupling arrangements of this kind are indicated in the equivalent circuit diagram of FIG. 2, by loop connections U1 and U2, the arrangement U1 being constituted between the resonators R1 and R6, and the arrangement U2 between the resonators R2 and R5. Each loop connection couples the associated resonators by transformer means, in addition to the coupling already provided in the shunt arms of the filter.

In the embodiment shown in FIG. 1, these transfer-coupling arrangements U1 and U2 are mechanically formed due to the fact that the surface wave is presented not only with coupling via the interference location, but also via an additional path by which it can reach a resonator which is not immediately adjacent thereto. To this end, at least two neighboring interference locations are connected with one another by at least one additional wall-like protuberance or one additional trench-like recess extending in the direction of propagation of the acoustic wave. Thus, in the embodiment shown in FIG. 1, the interference locations K2, K3 and K4 are connected with one another by an additional protuberance 10 which extends in the direction of propagation of the surface wave, this protuberance being followed by a recess 11 which likewise extends in said propagation direction and which interconnects the coupling points K4, K5 and K6. In this fashion the loop U1 which provides additional direct coupling between the resonators R1 and R6 is formed. Similarly, a further trench-like recess 11′ is provided, also extending in the direction of propagation of the surface wave, which interconnects the coupling points K3, K4 and K5 to form the loop U2. As described with reference to the interference location K13, any of these additional recesses and protuberances 10, 11 and 11′ can be in the form of an interrupted line, which can be produced in the surface of the filter body 5 relatively simply by continuous laser bombardment, for example.

In the electrical circuit diagram of FIG. 2, an additional transfer-coupling arrangement 16 is shown, which directly couples the resonant circuits R7 and R10, by-passing the intervening filter sections. In order to be able to adjust the coupling, a capacitor 17 may be included in the connecting line, and, if required can, be provided as a variable capacitor. This kind of purely electrical transfer coupling is formed, as shown, in the example shown in FIG. 1 by providing in the course of the filter body 5 at least one section of piezoelectric material in which the piezoelectric effect is exploited, and on each of which at least one additional pair of electrodes is applied to its surface. In FIG. 1, two such sections have been provided, one provided with a pair of electrodes 15, and the other with electrodes 15′. The additional pair of electrodes 15 serve to convert part of the surface wave back into electromagnetic energy, and by connecting the pairs of electrodes 15 and 15′ via the lines 16, this energy component is converted back into a surface wave again at the electrode pair 15′, so that the filter sections located between the electrode pairs 15 and 15′ are by-passed. To adjust the coupling, a variable capacitor 17 can be provided and this, if required, may be replaced by a more complex electrical network, which can also be combined in integrated circuit fashion, to form a single entity with the filter body 5. Depending upon the requirements imposed upon the filter behavior, it may not always be necessary to provide two or more additional pairs of electrodes in the course of the filter body 5, and in fact in many cases it will suffice to provide only one such electrode pair, for example the electrode pair 15, and to connect this pair of electrodes either with the input electrodes 3, 3′ or with the output electrode pair 4, 4′. In this fashion, too, additional by-pass lines can be formed which can be used to produce attenua-tion poles in the filter characteristic or to produce complex pole positions.

The tuning of the phase of the line sections between the interference locations, can be effected by additional interference locations within the line section which is to be tuned. For example, interference locations 17′ shown in FIG. 1, between the locations K11 and K12, serve to adjust resonant frequency required in the line resonator R9. Through this method, the effective length of the individual sections is modified, and the interference locations 17′ can be applied to the surface of the filter body 5 in any of the manners already described.

Figure 3:
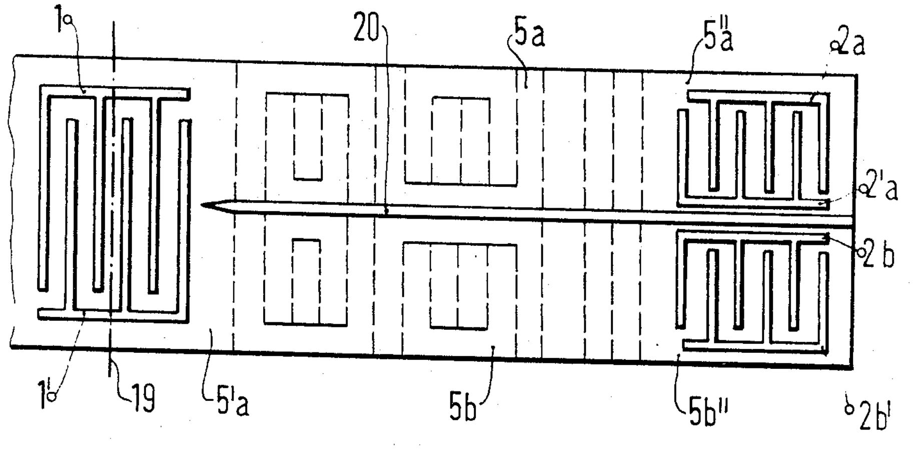
FIG. 3 illustrates the structure of an exemplary embodiment of a filter divider network using filters of the type shown in FIG. 1.

In the alternative embodiment shown in FIG. 3, a filter divider network is provided, in which several mutually decoupled filter systems are assembled to form a unit. Each of the individual filters can be designed in the manner already shown in FIG. 1, so that the intermediate filters 5*a* and 5*b* in FIG. 3 have been indicated schematically by broken lines. Both filters are coupled to a common input transducer 5*a*′, to whose input terminals 1 and 1′ the electromagnetic energy for the electrodes is applied and thus converted into an acoustic surface wave. The individual filters 5*a* and 5*b* are each assigned separate output transducer systems 5*a*″ and 5*b*″, with respective terminals 2*a*, 2*a*′, and 2*b*, 2*b*′, respectively. The decoupling of the individual filters is effected by a junction 20 extending in the direction of propagation of the surface wave and, in a manner similar to that provided by the additional junctions 10, 11 and 11′ of FIG. 1, may take the form of a trench-like recess, a wall-like protuberance or an interrupted line. It is merely necessary to ensure that the recess or protuberance is formed so that there is adequate decoupling between the two arms of the filter divider network. If the filter systems 5*a* and 5*b* are dimensioned so that they have mutually different pass bands, an electromagnetic wave, or input signal of relatively wide frequency band, injected at the input electrodes 1 and 1′ will be split into two sub-bands of different frequencies, one appearing at the output terminals 2*a* and 2*a*′, and the other appearing at the output terminals 2*b* and 2*b*′. If the divider network shown in FIG. 3 is constructed symmetrically with respect to a common transducer, as represented by a broken line 19, then a filter divider network with four pass bands of different frequencies is obtained, and at the same time a terminating resistor 6, as shown in the transducer system 5′ of the example in FIG. 1 is no longer necessary for the system 5*a*′. As a corresponding supplementation of the example shown in FIG. 3, a filter divider network with a fundamentally arbitrary number of subsidiary filters can be obtained, and, therefore, a fundamentally arbitrary sub-division of a wide frequency band into a predetermined number of sub-bands can be provided. With reciprocal design of the individual subsidiary filters, it is evident that the divider network of FIG. 3 can be used to assemble together several narrower sub-bands to form one wide transmission band.

In the filters described hereinbefore, the transducer elements used to convert the electrical energy into mechanical oscillatory energy, can be assigned oscillatory circuits in the form of lumped circuit elements, so that the bandwidth of the transducer elements is substantially increased. Furthermore, it is possible to assign to the transducer elements absorber resistors, which will likewise increase their bandwidth. These absorbers will conveniently take the form of a wave sink for acoustic waves. The principles of this type of wave sink is known from, for example, the German specification No. 1,541,965. In the present case, it is particularly convenient to design the absorbers as wedge-shaped varnish layers whose plan contours correspond substantially with that end of the electromechanical transducer disposed away from the transmission medium, and whose tips point in the direction towards the transmission medium. In this fashion, in other words, a constant basic attenuation, which does not alter the filter characteristic is obtained and which can be balanced by using an amplifier, if required.

It is also possible, to avoid the need for an abosrber by forming the transducer elements of a material which has a correspondingly poorer quality factor compared with the actual filter material. This can be achieved in such a manner that the actual filter is constructed from a quartz block forming the resonators and is provided with interference locations, or the filter is constructed from a non-piezoelectric material, such as quartz glass, while the transducer elements are formed by an electrostrictive ceramic.

With the filter described, because of the special design it is advantageously possible to arrange for the length of the individual resonators to be in the order of magnitude of about 2 mm. This means that the technological difficulties of manufacturing this type of filter are relatively minor, and also that the overall filter has adequately small dimensions to be utilized in applications in corresponding miniature circuits, for example such as integrated circuits.

Figures 4, 5:
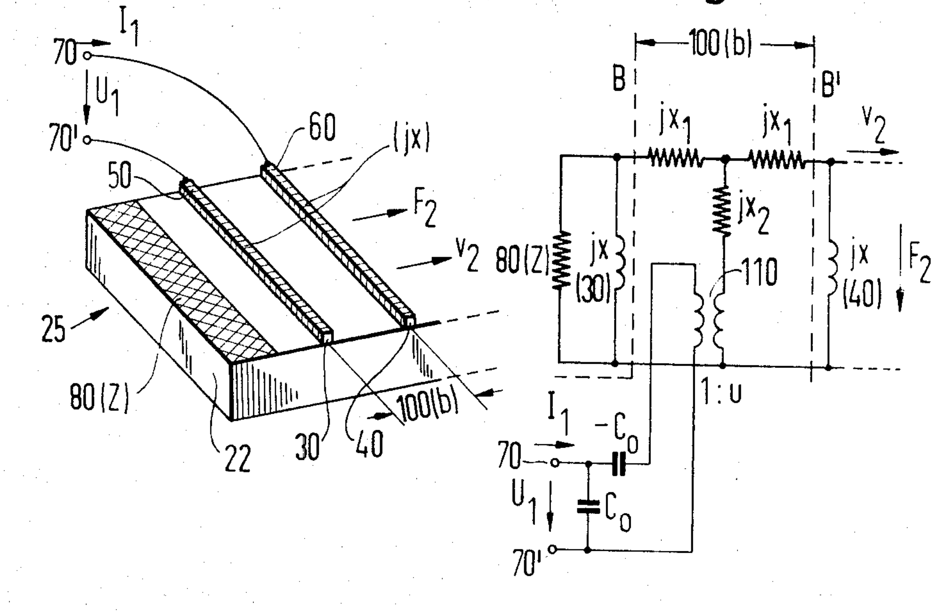
FIG. 4 illustrates the structure of an exemplary embodiment of an electromechanical transducer constructed in accordance with the principles of the present invention.
FIG. 5 is a schematic circuit diagram of the equivalent circuit of the exemplary transducer shown in FIG. 4.

FIG. 4 shows one exemplary embodiment of a transducer constructed in accordance with the invention. In this embodiment a transducer element 25 comprises a parallelopiped body 22 of piezoelectric material, at one side of which an acoustic wave sink 80 is applied. The advantageous embodiment illustrated, has excitation electrodes 50 and 60, required to excite the mechanical oscillations, which are simultaneously designed as interference locations 30 and 40. The excitation electrodes 50 and 60 can, in this context for example, be applied to the piezoelectric body 22 by vaporizing them onto the substrate, and are formed as parallel ridges which extend perpendicularly to the direction of propagation of the acoustic wave. To the excitation electrodes 50 and 60, wire leads 70 and 70' are connected. An a.c. input voltage $U_1$ is applied to the leads 70, 70' to produce a current $I_1$. A line section 100 is formed between the interference locations 30 and 40, and this has a phase constant $b$, the dimensions being such that the interference locations 30 and 40, together with the mechanical line section which they enclose, creates an acoustic resonator for the particular prescribed operating frequency. Fundamentally, with transducers of this kind, all the known types of mechanical oscillations can be excited, but, for reasons of simpler illustration, in the drawing a transducer for exciting acoustic surface oscillations has been illustrated. With an a.c. voltage $U_1$ applied to the terminals 70 and 70' through known mechanisms occurring in the piezoelectric body 22, an acoustic surface oscillation is excited which, viewed in the direction of propagation, produces a force F2 and has a velocity $v_2$. The broken lines extending toward the right are intended to indicate that the transducer is followed immediately by a filter in this case.

Making reference to FIG. 5, the electrical operation of the arrangement shown in FIG. 4 will now be discussed in detail.

If one considers the transducer of FIG. 4, without the interference locations 30 and 40 and the acoustic wave sink 80, an equivalent circuit diagram of the type shown between two broken lines B and B' in FIG. 5 would apply. This equivalent circuit diagram has already been discussed in the book by Mason described in the introductory portion of this specification, in particular on page 238 thereof. A three-port electrical system is created, in which a T-network is formed, with reactive elements $x_1$ in each series arms, and a reactive element $x_2$ in series with a transformer 110 in the shunt arm, coupled to the electrical input circuit. The T-network consisting of the reactive elements $x_1$ and $x_2$ here constitutes the equivalent circuit diagram for the acoustic line 100 (see FIG. 4). The electrical input quantities appearing at the terminals 70 and 70', are once again marked $U_1$ and $I_1$, while the output quantities are marked $F_2$ and $v_2$ as in FIG. 4. The transducer 110 has a transformation ratio of 1:u and there also appears in the electrical input circuit a shunt capacitance Co which simulates the static capacitance of the transducer. The derivation of the equivalent circuit diagram also yields a capacitor with a capacitance of $-C_o$ in the input series arm. Using the known method of calculation, we obtain here, for the transformation ratio $u$ and the reactances $x_1$ and $x_2$, the values defined by the following equations:

$$u = K\sqrt{2C_o\, vZ/\lambda o} = K\sqrt{2C_o\, Zf_o} \qquad (1)$$

$$x_1 = Z\tan(\alpha/2)\,\eta = Z\tan(\alpha/2\, f/f_o) \qquad (2)$$

$$x_2 = (-Z/\sin\alpha\,\eta) = [-Z/\sin(\alpha f/f_o)] \qquad (3)$$

where:

$v$ is the velocity of propagation of surface waves;

Z is the surface wave impedance which simultaneously serve as the mechanical reference impedance in the formula;

$1/\omega_o C_o$ is the electrical reference impedance;

K is the effective electromechanical coupling factor of the material, referred to in the introduction; and $\eta = f/f_o$ is a frequency variable standardized on the reference frequency $f_o = v/\lambda_o = \omega_o/2\pi$.

In order that the interference locations 30 and 40, in association with the intervening line 100 shall form an acoustic resonator, in a general way design in accordance with the following equation is required:

$$b = m\pi - \arctan 2x \qquad (4)$$

For the special case shown in FIG. 4, $m$=1 and therefore $\alpha = b$, and one obtains for the desired relative bandwidth B the relationship for the magnitude of the interference locations $x$ described by the following equation:

$$x \approx 1/2\,\pi B \qquad (5)$$

In the equivalent circuit diagram of FIG. 5, which corresponds to the actual mechanical arrangement the embodiment shown in FIG. 4, the interference locations 30 and 40 appear, enclosing the transducer, which are represented by inductors $jx$. Furthermore, the wave sink 80 is represented by a terminating impedance Z, absorbing mechanical waves which propagate in opposition to the desired direction of propagation. The reactance $x$ to be assigned in accordance with the aforementioned equations to the particular interference locations can be determined, for example, by measurement and depends upon the height and width dimensions of the particular interference location.

In the example shown in FIG. 4, the interference locations 30 and 40 take the form of wall-like protuberances, so that in the electrical equivalent circuit diagram of FIG. 5 an inductive interference is produced, in accordance with the force-stress analogy. It is not essential to design the interference locations as protuberances, and instead they can take the form of trench-like recesses, or both. A trench-like recess, following the force-stress analogy will appear as a capacitor in the shunt arm of the equivalent circuit diagram. From the production point of view, it would also be a favorable approach, instead of the trench-like recess or the wall-like protuberance, simply to use an interrupted line as the interference location. This line can then for example take the form of a sequence of spots which can be produced in the piezoelectric body 22 relatively simply, for example, by means of a laser.

Again, it is possible to effect trimming by removal of material from a wall-like protuberance, as described with reference to the filter embodiments, so that the interference location jx can be finally trimmed.

In the example of FIG. 4, the overall transducer 25 is so designed that the interference locations 30 and 40 enclose only one transducer, with a length of about half a wave length. Where there are several half-wave transducers, the pass band attenuation $a_o$ is given approximately, for a number $n$ of half-wave transducers enclosed by two identical interference locations $jx$, the following equation:

$$a_o \approx 1/2\ (1n\ \pi x^2/2nK^2) + 1/2\ 1n\ \{1 + (n\ \pi/4x^2)^2\ [2\ (\eta - (1 - 2x/\pi n))]^2\} \qquad (6)$$

where $2nK^2/\pi < x^2 << 1$ and $n^2\,\pi^2 \cdot (\eta - 1)^2 << 1$. The relative bandwidth B is then given by:

$$B = 4x^2/n\pi \qquad (7)$$

and the lowest pass band attenuation for a transducer in which the interference locations $jx$ enclose between them $n$ half-wave transducers is:

$$a_o = 1/2\ 1n\ (\pi x^2/2nK^2) = 1/2\ 1n\ (\pi^2 B/8.K^2)$$

where $\eta$ is the related frequency $f/f_o$. The reflection factor $r$ of the interference location is given by the equation:

$$r = 1\ \overline{1 + j}\ \sqrt{\pi B}$$

if the line is terminated in a non-reflecting manner after the location.

As equation (6) shows, therefore, with a transducer constructed in accordance with the principles of the present invention, assuming a bandwidth of, for example 10 kHz, a center frequency of 1 MHz and an effective electromechanical coupling factor on the part of the material of K=5 percent, an attenuation of only 7 dB can be achieved, i.e. the input and output transducers of an electromechanical filter together have a pass band attenuation of only 14 dB.

It is not absolutely essential for the interference locations to enclose only one transducer between them, equally it is not essential for the interference locations (30 and 40 in FIG. 4) simultaneously to be designed as excitation electrodes. Furthermore, between the excitation electrodes and the interference locations a further line section can be provided. Technologically, this is a particular advantage if the interference locations are designed as an interrupted line or trench-like recess because in such a case the application of the excitation electrodes is facilitated. A corresponding example has been shown in FIG. 6, the equivalent circuit diagram of which appears in FIG. 7. To simplify matters, in FIGS. 6 and 7 elements having the same function are given the same reference characters as in FIGS. 4 and 5, so that the explanations provided in respect of the latter can be applied directly to the example of FIG. 6 and its equivalent circuit diagram of FIG. 7.

Figure 6:
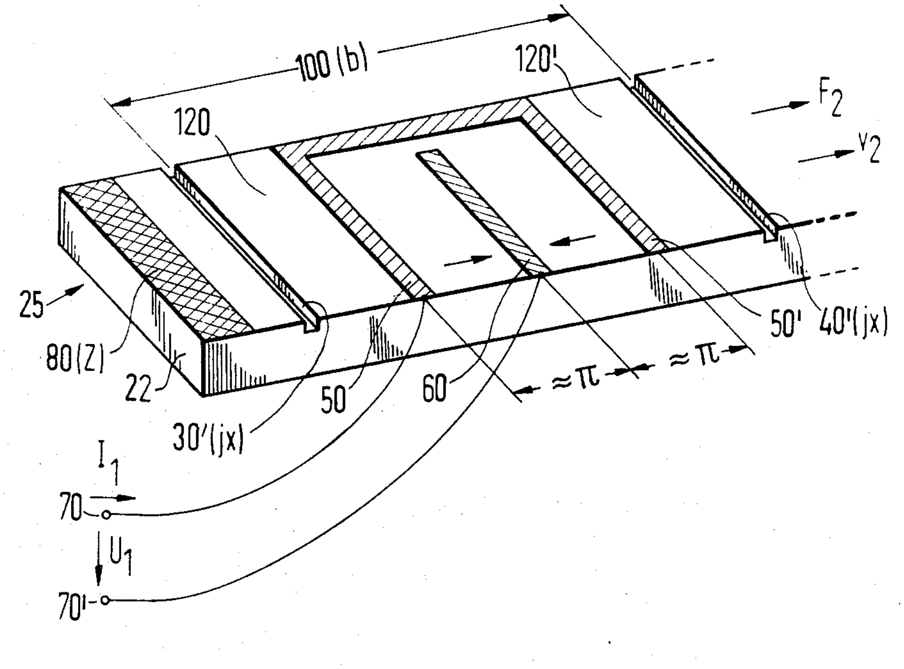
FIG. 6 illustrates the structure of another exemplary embodiment of a transducer constructed in accordance with the principles of the present invention.
Figure 7:
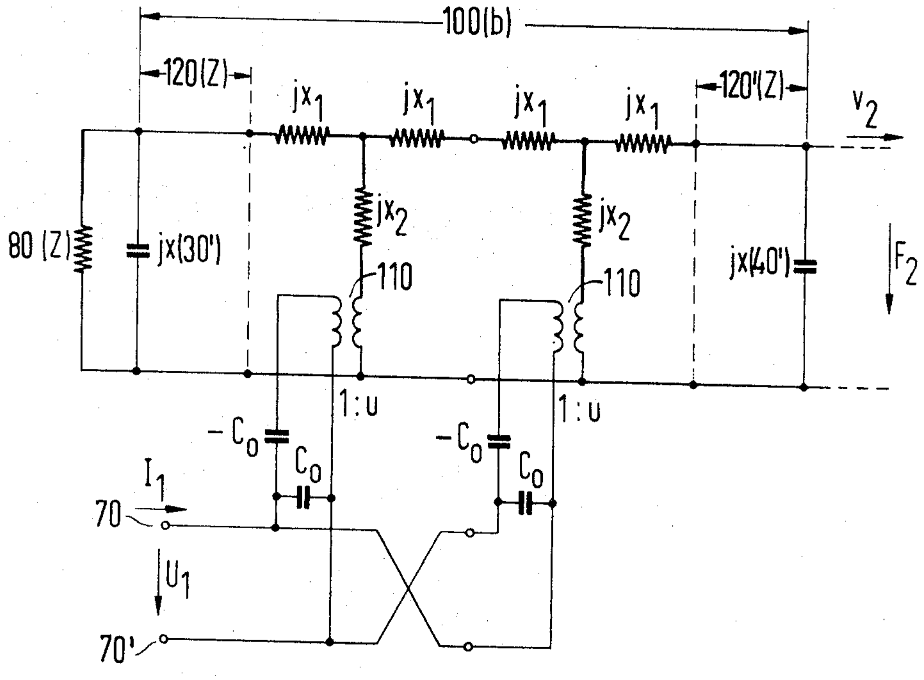
FIG. 7 is a schematic diagram of the equivalent circuit of the transducer shown in FIG. 6.

In the example shown in FIG. 6, the interference locations 30' and 40' are designed as trench-like recesses which enclose a line section 100 with the phase constant $b$. The equation (4) can be employed directly to calculate the phase constant $b$. Two transducer elements with respective excitation electrodes 50 and 50', and a common electrode 60, are provided, which in each case correspont to an interval of half a wave length, this representing, as far as the phase constant is concerned, a phase $\pi$. Between the excitation electrode 50 and an interference location 30', and between the excitation electrode 50' and an interference location 40', in each case there is a line section whose respective lengths are 120 and 120' forming the sections having a surge impedance Z. In the simplest case, the line lengths 120 and 120' will be made identical to one another, although this is not mandatory. Apart from the possibility of allowing the interference locations 30' and 40' to coincide with the excitation electrodes 50 and 50' as already described in relation to FIG. 4, it is possible in the example of FIG. 6 to also provide an interference location along the excitation electrode 60, or, in the manner already described, to deliberately apply the excitation electrode 60 in such a thickness that it acts as an interference location with respect to acoustic waves. The same also applies to the excitation electrodes 50 and 50', and in a similar manner, the same applies to the arrangement of more than two half-wave transducers, in which case the result is substantially a cascade arrangement of such transducers.

Advantageously, the interference locations enclosing the transducers will be so designed that they have reflectivities of the same magnitude. As far as the equivalent circuit diagram is concerned, this means that the absolute magnitude of the reactances $jx$ is the same throughout, i.e. it is quite possible for one interference location to act inductively and for the other to act capacitively. If the interference locations 30 and 40, and 30' and 40' are not absolutely identical in terms of their reflective action, then the overall mode of operation is not fundamentally affected, and all that happens is that, depending upon the difference, a higher basic attenuation is obtained compared with that defined by equation (6). The interference locations are arranged to differ from one another if the transducer 25 is followed by a further acoustic system and the interference location 40 or 40' located in the direction of propagation of the wave is involved in this further system. In the equivalent circuit diagram of FIG. 7, in respect of which, according to equations (2), (3) and (4), the relationships $\alpha \approx \pi$ and $m=4$ apply, the transducer elements form a parallel arrangement of two electrical input sections, and the antiphase excitation (represented in FIG. 6 by oppositely-directed arrows) of the successive transducers 50 and 60, and 50' and 60', appears as a line crossover. The interference locations 30' and 40' take the form of trench-like recesses, and therefore appear, as already explained, in the form of capacitive reactances which enclose between them the parallel-connected transducers together with the line sections 120 and 120'.

Although I have described my invention by reference to specific illustrative embodiments, many changes and modifications may become apparent to those skilled in the art without departing from the spirit and scope of my invention. I therefore intend to include within the patent warranted hereon all such changes and modifications as may reasonably and properly be included within my contribution to the art.

What I claim is:

1. An electromechanical device comprising: a body including at least a portion thereof of piezoelectric material, electrodes carried on said body to convert electromagnetic oscillations into acoustic surface oscillations, a surface of said body having interference locations for surface waves, which interference locations extend substantially perpendicular to the direction of wave propagation and have dimensions in said direction which are small compared with the wavelength of the surface wave, and a resonator being formed by each interval between adjacent interference locations in association with the intervening surface sections.

2. An electromechanical device as claimed in claim 1, in which at least one of said interference locations is defined by a trench-like recess extending perpendicular to the direction of wave propagation.

3. An electromagnetic device as claimed in claim 1, wherein at least one of said interference locations extends only over part of the surface of said body.

4. An electromechanical device as claimed in claim 1, comprising at least one additional pair of electrodes carried on said surface and electrically connected to the aforementioned electrodes.

5. An electromechanical device as claimed in claim 1, comprising at least one line section on said body defining a coupling line.

6. An electromechanical device as claimed in claim 1, comprising additional interference locations carried on said surface to trim said device by modifying the effective length between the initially mentioned interference locations.

7. An electromechanical device as claimed in claim 1, operable as a filter and comprising output electrodes carried on said body.

8. An electromechanical device as claimed in claim 1, operable as a filter comprising an input transducer and an output transducer coupled together via said body.

9. An electromechanical device comprising: a body including at least a portion thereof of piezoelectric material, electrodes carried on said body to convert electromagnetic oscillations into acoustic surface oscillations, a surface of said body having interference locations for surface waves, which interference locations extend substantially perpendicular to the direction of wave propagation and have dimensions in said direction which are small compared with the wave length of the surface wave, and a resonator being formed by each interval between adjacent interference locations in association with the intervening surface sections, at least one of said interference locations defined by a wall-like protuberance extending perpendicular to the direction of wave propagation.

10. An electromechanical device comprising: a body including at least a portion thereof of piezoelectric material, electrodes carried on said body to convert electromagnetic oscillations into acoustic surface oscillations, a surface of said body having interference locations for surface waves, which interference locations extend substantially perpendicular to the direction of wave propagation and have dimensions in said direction which are small compared with the wave length of the surface wave, and a resonator formed by each interval between adjacent interference locations in association with the intervening surface sections, at least one interference location defined by an interrupted line of detent spots extending perpendicular to the direction of wave propagation.

11. An electromechanical device comprising: a body including at least a portion thereof of piezoelectric material, electrodes carried on said body to convert electromagnetic oscillations into acoustic surface oscillations, a surface of said body having interference locations for surface waves, which interference locations extend substantially perpendicular to the direction of wave propagation and have dimensions in said direction which are small compared with the wave length of the surface wave, and a resonator formed by each interval between adjacent interference locations in association with the intervening surface sections, at least one of said interference locations defined as a recess in and a protuberance from the surface of said body.

12. An electromechanical device comprising: a body including at least a portion thereof of piezoelectric material, electrodes carried on said body to convert electromagnetic oscillations into acoustic surface oscillations, a surface of said body having interference locations for surface waves, which interference locations extending substantially perpendicular to the direction of wave propagation and have dimensions in said direction which are small compared with the wave length of the surface wave, and a resonator being formed by each interval between adjacent interference locations in association with the intervening surface sections, at least two adjacent interference locations connected with one another by at least one protuberance extending in the direction of propagation of the acoustic wave.

13. An electromechanical device as claimed in claim 12, wherein said additional protuberance comprises an interrupted line.

14. An electromechanical device comprising: a body including at least a portion thereof of piezoelectric material, electrodes carried on said body to convert electromagnetic oscillations into acoustic surface oscillations, a surface of said body having interference locations for surface waves, which interference locations extend substantially perpendicular to the direction of wave propagation and have dimensions in said direction which are small compared with the wave length of the surface wave, and a resonator formed by each interval between adjacent interference locations in association with the intervening surface sections, at least two adjacent interference locations connected with one another by at least one recess extending in the direction of propagation of the acoustic wave.

15. An electromechanical device as claimed in claim 14, wherein said additional recess comprises an interrupted line.

16. An electromechanical device comprising: a body including at least a portion thereof of piezoelectric material, electrodes carried on said body to convert electromagnetic oscillations into acoustic surface oscillations, a surface of said body having interference locations for surface waves, which interference locations extend substantially perpendicular to the direction of wave propagation and have dimensions in said direction which are small compared with the wave length of the surface wave, and a resonator formed by each interval between adjacent interference locations in association with the intervening surface sections, and comprising a plurality of additional pairs of electrodes carried on said surface, said additional pairs of electrodes being interconnected to form by-passes.

17. An electromechanical device as claimed in claim 16, comprising a line connecting different electrode pairs and includes an electrical network in said line to provide additional poles.

18. An electromechanical device operable as a filter comprising: a body including at least a portion thereof of piezoelectric material, electrodes carried on said body to convert electromagnetic oscillations into acoustic surface oscillations, a surface of said body having interference locations for surface waves, which interference locations extend substantially perpendicular to the direction of wave propagation and have dimensions in said direction which are small compared with the wave length of the surface wave, and a resonator formed by each interval between adjacent interference locations in association with the intervening surface sections, means on said surface of said body defining at least two mutually decoupled filter systems having different pass bands, a common input transducer system for exciting said two filter systems, and respective output transducer systems coupled to said input transducer system via said body for said two filter systems to form a divider network.

19. An electromechanical device as claimed in claim 18, wherein said individual resonators are tuned to a resonance frequency in the order of magnitude of 800 KC/s.

20. An electromechanical device as claimed in claim 19, in which said transducer systems are assigned oscillatory circuits comprising lumped circuit elements.

21. An electromechanical device as claimed in claim 19, comprising absorber resistors connected to each of said transducer systems.

22. An electromechanical device as claimed in claim 19, wherein said transducer systems comprise a piezoelectric material that has a lower quality factor than the material used for the intermediate filter body.

23. An electromechanical device operable as a transducer comprising: a body including at least a portion thereof of piezoelectric material, electrodes carried on said body to convert electromagnetic oscillations into acoustic surface oscillations, a surface of said body having interference locations for surface waves, which interference locations extend substantially perpendicular to the direction of wave propagation and have dimensions in said direction which are small compared with the wave length of the surface wave, and a resonator formed by each interval between adjacent interference locations in association with the intervening surface sections, said body including electrostrictive material and a wave sink in the direction opposite to the requisite direction of propagation of the waves.

24. An electromechanical device as claimed in claim 23, wherein said body is terminated at both ends by interference locations for acoustic waves, which form together with the intervening mechanical line section an acoustic resonator for the predetermined operating frequency.

25. An electromechanical device as claimed in claim 23, wherein said interference locations enclose only one transducer element having a length substantially equivalent to half a wavelength.

26. An electromechanical device as claimed in claim 23, wherein said interference locations enclose therebetween several transducer elements each having a length of substantially half a wavelength.

27. An electromechanical device as claimed in claim 23, wherein said external excitation electrodes simultaneously serve as said interference locations.

28. An electromechanical device as claimed in claim 23, in which said interference locations are spaced apart by said transducer elements and by additional line sections.

29. An electromechanical device as claimed in claim 23, wherein said interference locations have mutually equal reflectivities.

* * * * *